United States Patent
Petrov et al.

(10) Patent No.: US 9,906,230 B2
(45) Date of Patent: Feb. 27, 2018

(54) PLL SYSTEM AND METHOD OF OPERATING SAME

(71) Applicant: HUAWEI TECHNOLOGIES CO., LTD., Shenzhen (CN)

(72) Inventors: Dmitry Petrov, Ottawa (CA); Haitao Mei, Kanata (CA)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/099,108

(22) Filed: Apr. 14, 2016

(65) Prior Publication Data

US 2017/0302284 A1    Oct. 19, 2017

(51) Int. Cl.
| | |
|---|---|
| H03L 7/099 | (2006.01) |
| H03L 7/089 | (2006.01) |
| H03L 7/091 | (2006.01) |
| H03B 5/12 | (2006.01) |

(52) U.S. Cl.
CPC .......... *H03L 7/099* (2013.01); *H03B 5/1212* (2013.01); *H03B 5/1243* (2013.01); *H03L 7/0891* (2013.01); *H03L 7/091* (2013.01); *H03L 7/0995* (2013.01)

(58) Field of Classification Search
CPC ....... H03L 7/0891; H03L 7/091; H03L 7/099; H03L 7/0995; H03B 5/1212; H03B 5/1243
See application file for complete search history.

(56) References Cited

U.S. PATENT DOCUMENTS

| | | | | |
|---|---|---|---|---|
| 5,821,818 A | * | 10/1998 | Idei ......................... | H03L 7/099 327/105 |
| 6,016,113 A | * | 1/2000 | Binder .................. | H03M 1/201 341/120 |
| 6,566,966 B1 | * | 5/2003 | Bellaouar ............... | H03L 7/189 331/10 |

(Continued)

FOREIGN PATENT DOCUMENTS

| | | |
|---|---|---|
| CN | 1365190 A | 8/2002 |
| CN | 102522984 A | 6/2012 |

(Continued)

OTHER PUBLICATIONS

Wilson, William B., Moon, Un-Ku, Lakshmikumar, Kadaba R., et al. A CMOS self-calibrating frequency synthesizer Solid-State Circuits, IEEE Journal of, 2000, vol. 35, No. 10, p. 1437-1444.

(Continued)

*Primary Examiner* — Thomas J Hiltunen
(74) *Attorney, Agent, or Firm* — Norton Rose Fulbright Canada LLP

(57) ABSTRACT

The phase-lock loop (PLL) can include a variable frequency oscillator adjustable to control the phase of the output signal; a primary control subsystem including a phase detector and a connection between the output signal and the phase detector, the phase detector generating a primary control signal to adjust the variable frequency oscillator; and a secondary control subsystem having an analog-to-digital converter and a digital-to-analog converter connected in series to receive the primary control signal and generate a secondary control signal also connected to independently adjust the variable frequency oscillator.

17 Claims, 8 Drawing Sheets

(56) References Cited

U.S. PATENT DOCUMENTS

| | | | | |
|---|---|---|---|---|
| 6,674,824 B1* | 1/2004 | Chiueh | H03K 3/0322 | 375/373 |
| 6,803,827 B1* | 10/2004 | Kenney | H03L 7/107 | 331/1 A |
| 6,900,675 B2* | 5/2005 | Briones | H03L 7/087 | 327/147 |
| 7,049,866 B2* | 5/2006 | Wilson | H03L 7/0891 | 327/157 |
| 7,095,287 B2* | 8/2006 | Maxim | H03L 7/0893 | 331/11 |
| 7,133,485 B1 | 11/2006 | Baird et al. | | |
| 7,463,098 B2* | 12/2008 | Baird | H03L 7/099 | 327/156 |
| 7,551,037 B2* | 6/2009 | Isobe | H03L 7/0802 | 327/157 |
| 7,737,875 B2* | 6/2010 | Waltari | H03M 1/206 | 341/158 |
| 7,848,719 B2* | 12/2010 | Krishnaswamy | H01Q 3/28 | 327/105 |
| 8,098,110 B2* | 1/2012 | Yang | H03L 1/023 | 331/175 |
| 8,154,350 B2* | 4/2012 | Faison | H03L 7/099 | 327/157 |
| 8,274,317 B2* | 9/2012 | Cho | H03L 7/099 | 327/147 |
| 8,339,165 B2* | 12/2012 | Dunworth | H03L 7/089 | 327/152 |
| 8,373,460 B2* | 2/2013 | Sinha | H03L 7/089 | 327/150 |
| 8,421,542 B2* | 4/2013 | Romano | H03L 7/099 | 327/156 |
| 8,643,409 B2* | 2/2014 | Lu | H03L 7/0995 | 327/119 |
| 8,878,614 B2* | 11/2014 | Yin | H03L 7/099 | 327/147 |
| 9,236,871 B1* | 1/2016 | Hu | H03L 7/093 | |
| 9,641,164 B2* | 5/2017 | Tohidian | H03K 5/133 | |
| 2002/0135428 A1* | 9/2002 | Gomez | H03L 7/1072 | 331/17 |
| 2003/0016088 A1* | 1/2003 | Scheffler | H03L 7/099 | 331/100 |
| 2009/0219100 A1* | 9/2009 | Pullela | H03C 3/0925 | 331/44 |
| 2009/0289723 A1* | 11/2009 | Maeda | H03C 3/04 | 331/15 |
| 2010/0171535 A1* | 7/2010 | Shanan | H03L 7/1976 | 327/157 |
| 2012/0049913 A1* | 3/2012 | Tadjpour | H03L 7/104 | 327/157 |
| 2015/0145566 A1* | 5/2015 | Perrott | H03L 7/0991 | 327/154 |

FOREIGN PATENT DOCUMENTS

| | | |
|---|---|---|
| CN | 10298871 A | 2/2013 |
| CN | 103259533 A | 8/2013 |

OTHER PUBLICATIONS

Staszewski, Robert Bogdan. Digital deep-submicron CMOS frequency synthesis for RF wireless applications. UMI No. 3076673, Ph. D Dissertation, 2002, p. 48-66.

SIPO of the P.R. China; International Search Report and Written Opinion issued in corresponding international Application No. PCT/CN2016/076493 dated Dec. 30, 2016.

* cited by examiner

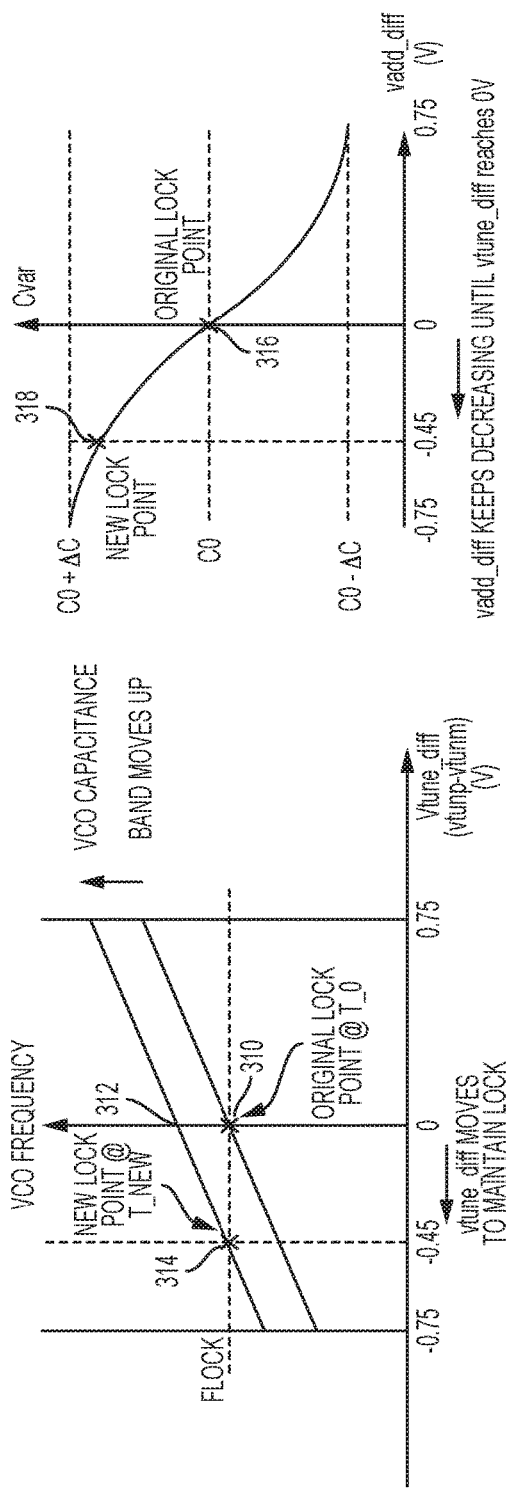
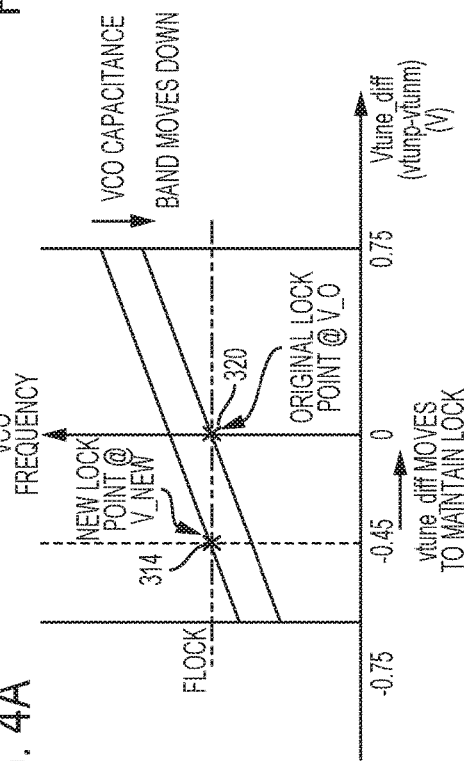
FIG. 4A
FIG. 4B
FIG. 4C

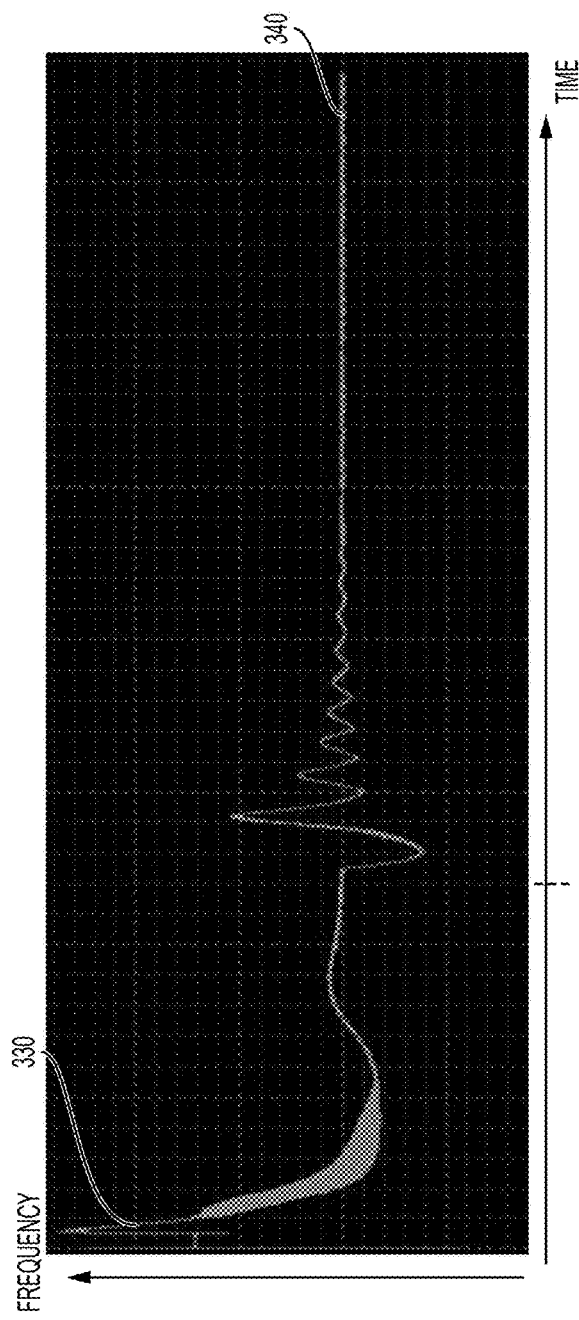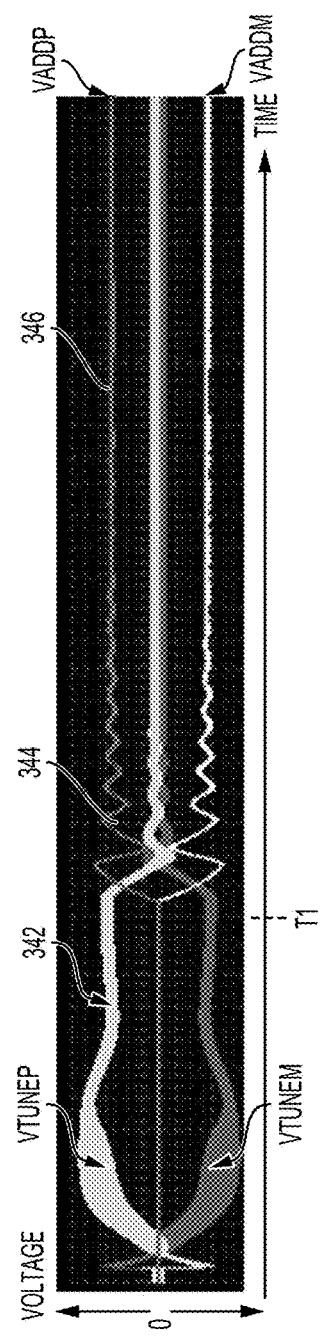
FIG. 5A
FIG. 5B

PLL SYSTEM AND METHOD OF OPERATING SAME

FIELD

The improvements generally relate to the field of phase lock loop (or phase-locked loop) circuits (PLL's), and more specifically to PLLs of the analog voltage-controlled oscillator control type.

BACKGROUND

Phase-locked loop control systems (PLLs) are used in a wide variety of applications requiring an output signal with a phase locked to the phase of an input signal. PLLs can be used in clocking systems, for instance. PLLs include a variable frequency oscillator (typically a voltage-controlled oscillator—VCO) and a control loop. The control loop compares the phase of the output signal received from the VCO to the phase of the input signal. A control signal (typically a voltage) is generated based on the comparison and is used to adjust the frequency of the VCO until the loop matches the phases. The output signal frequency can be a multiple of the input signal frequency. The control signal can be differential or single-ended depending on the application. Modern PLLs are typically embodied in the form of an integrated circuit as part of an electronic chip.

While various forms of PLLs have been found to be satisfactory to a certain degree, there remains room for further improvement. Indeed, VCO power supply noise can cause phase jitter, and the VCO frequency can be affected by changes in temperature. Some applications require a direct connection between the VCO and a noisy supply bump, which can make the PLL particularly exposed to noise-induced jitter. Some applications, such as clocking systems of antenna towers for instance, require maintaining clocking system operation within extreme temperature ranges, such as −40 to 125° C., for instance, which can induce VCO frequency shifts that exceed the control loop compensation capacity since the voltage range generated by the control loop is typically limited. Applications where power supply noise and extreme temperature variations are combined can cause particular design challenges for PLLs.

SUMMARY

Embodiments are described herein where a secondary control subsystem is used. The secondary control subsystem is connected also to receive the primary control signal of the primary control subsystem (control loop) and is operable to respond directly to changes in the primary control signal by independently controlling a secondary varactor element.

In accordance with one aspect, there is provided a phase-lock loop (PLL) system for generating an output signal being phase-locked to an input signal, the PLL system comprising: a variable frequency oscillator being adjustable to control a phase/frequency of the output signal; a primary control subsystem including a phase detector and a connection between the output signal and the phase detector, the phase detector being configured to compare phases of the input signal and of the output signal, and generate a primary control signal based on the comparison, the primary control signal being analog and connected to adjust the variable frequency oscillator; and a secondary control subsystem having an analog-to-digital converter and a digital-to-analog converter connected in series to receive the primary analog control signal and generate a secondary analog control signal connected to adjust the variable frequency oscillator.

In accordance with another aspect, there is provided a method of operating a phase-lock loop (PLL) system having a variable frequency oscillator, a primary control subsystem including a phase detector, and a secondary control subsystem, the method comprising: changing a frequency of the variable frequency oscillator, thereby changing an output signal from a former phase to a subsequent phase; the primary control subsystem generating a primary control signal indicative of a difference between the subsequent phase and a phase of an input signal, the primary control signal being shifted from a design value; the primary control signal controlling the variable frequency oscillator to adjust the frequency/phase of the output signal as a function of the phase of the input signal to compensate for the changing of frequency; the secondary control subsystem reacting to the primary control signal and also controlling the variable frequency oscillator to adjust a frequency/phase of the output signal as a function of the phase of the input signal, resulting in overcompensation of the changing of frequency; the primary control subsystem modifying the primary control signal in reaction to said overcompensation by bringing the primary control signal back to the design value; and the secondary control subsystem maintaining the control of the variable frequency oscillator and the adjustment of the frequency/phase of the output signal once the primary control signal is back to the design value.

Many further features and combinations thereof concerning the present improvements will appear to those skilled in the art following a reading of the instant disclosure.

DESCRIPTION OF THE FIGURES

In the figures,

FIGS. 4A, 4B and 4C are graphs showing varactor capacitance changes;

FIGS. 5A and 5B show a simulated example response of signal variation over time during operation of the PLL system of FIG. 3, with FIG. 5A plotting output signal frequency over time following a VCO frequency shift and FIG. 5B plotting the primary control signal and the secondary control signal over time;

DETAILED DESCRIPTION

Figure 1:
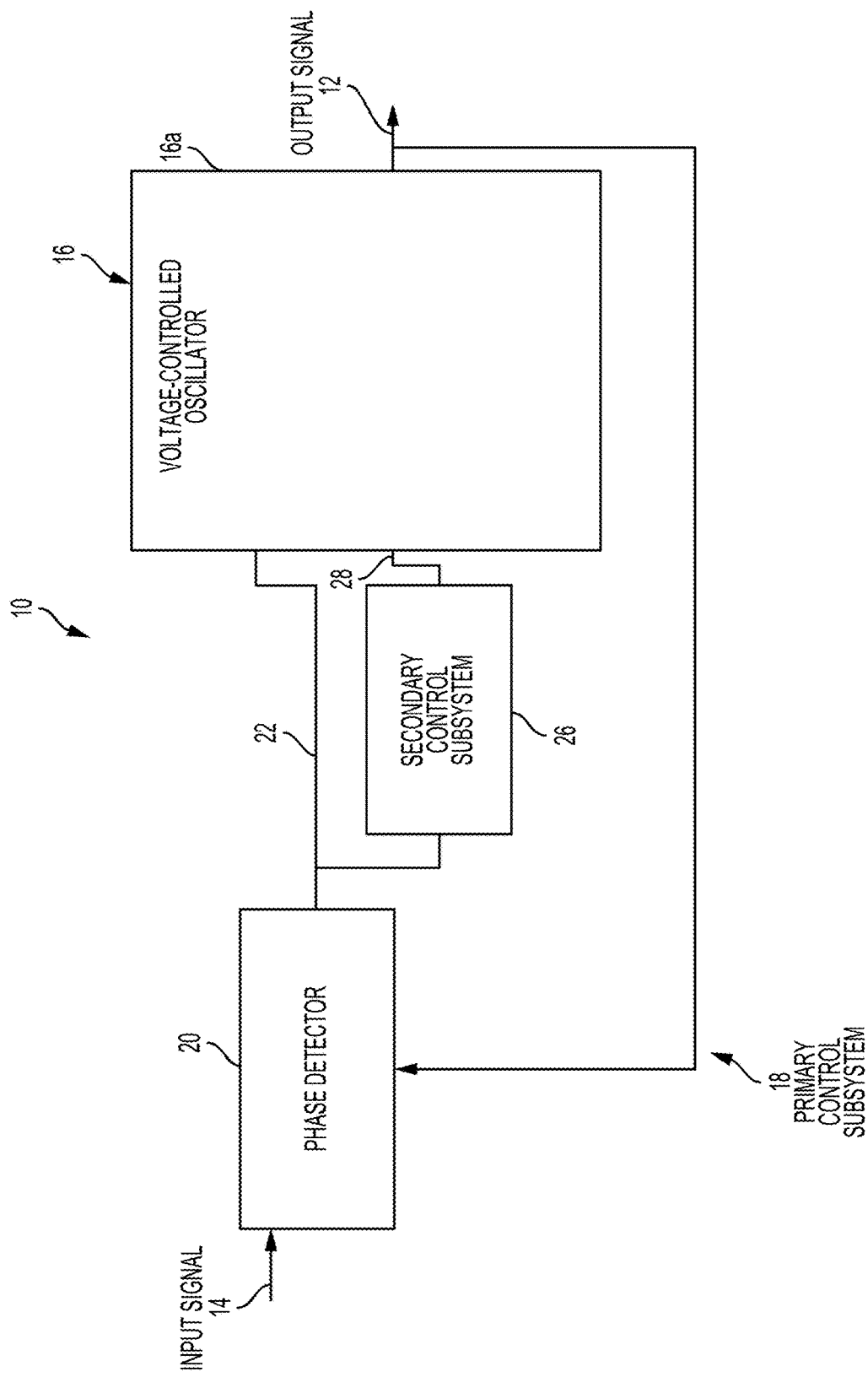
FIG. 1 is a simplified block diagram of an example PLL system.

FIG. 1 is a simplified block diagram of an example PLL system 10 which generates an output signal 12 having a phase matched to a phase of the input signal 14 having the reference phase. In this example, the variable frequency oscillator 16 is a voltage-controlled oscillator (VCO) 16a. The PLL system 10 has a primary control subsystem 18 in the form of a control loop and which has a phase detector 20 which compares the phase of the output signal 12 with the reference phase of the input signal 14 and generates a signal indicative of the difference between the phases. This signal will be referred to herein as the primary control signal 22 as it is used to adjust the frequency of the VCO 16a. This primary control subsystem 18 can be based on existing technology and will typically detect and react to a change in the frequency of the VCO 16a (e.g. a frequency shift imparted by temperature change, supply noise, or another source) by an analog change in voltage of the primary control signal 22. The change in voltage will adjust the VCO 16a to bring the phase/frequency of the VCO 16a back into lock with the phase/frequency of the input signal 14. The primary control signal 22 can be differential or single ended.

Traditional primary control subsystems are designed as a function of an 'equilibrium' or 'design' value of the voltage of the primary control signal; i.e. the components of the primary control subsystem are optimized for best performance (e.g. lower clocking system phase jitter) at the design voltage value. The design voltage value can be a zero difference of potential in the case of a differential primary analog control signal, or set to a given difference of potential relative to a ground reference or other reference in the single-ended scenario. In the absence of a secondary control subsystem 26 such as will be described below, the primary control subsystem would typically react in the change in VCO frequency by a persisting shift in the primary control signal from the design value. This shift would persist as long as the frequency shift of the VCO persists. The primary control subsystem may react to such persisting shifts in the primary control signal by undesired additional noise or jitter induction.

In the example shown in FIG. 1, the PLL system 10 further has a secondary control subsystem 26 which indirectly reacts to the primary control signal 22 by generating a secondary control signal 28. The secondary control signal 28 is used to independently adjust the frequency of the voltage-controlled oscillator 16, which can initially result in overcompensation. Since the secondary control subsystem 26 uses the primary control signal 22 as its input, it does not directly react to phase/frequency change, but rather indirectly reacts to the phase/frequency change via the shift in the primary control signal 22.

Figure 2:
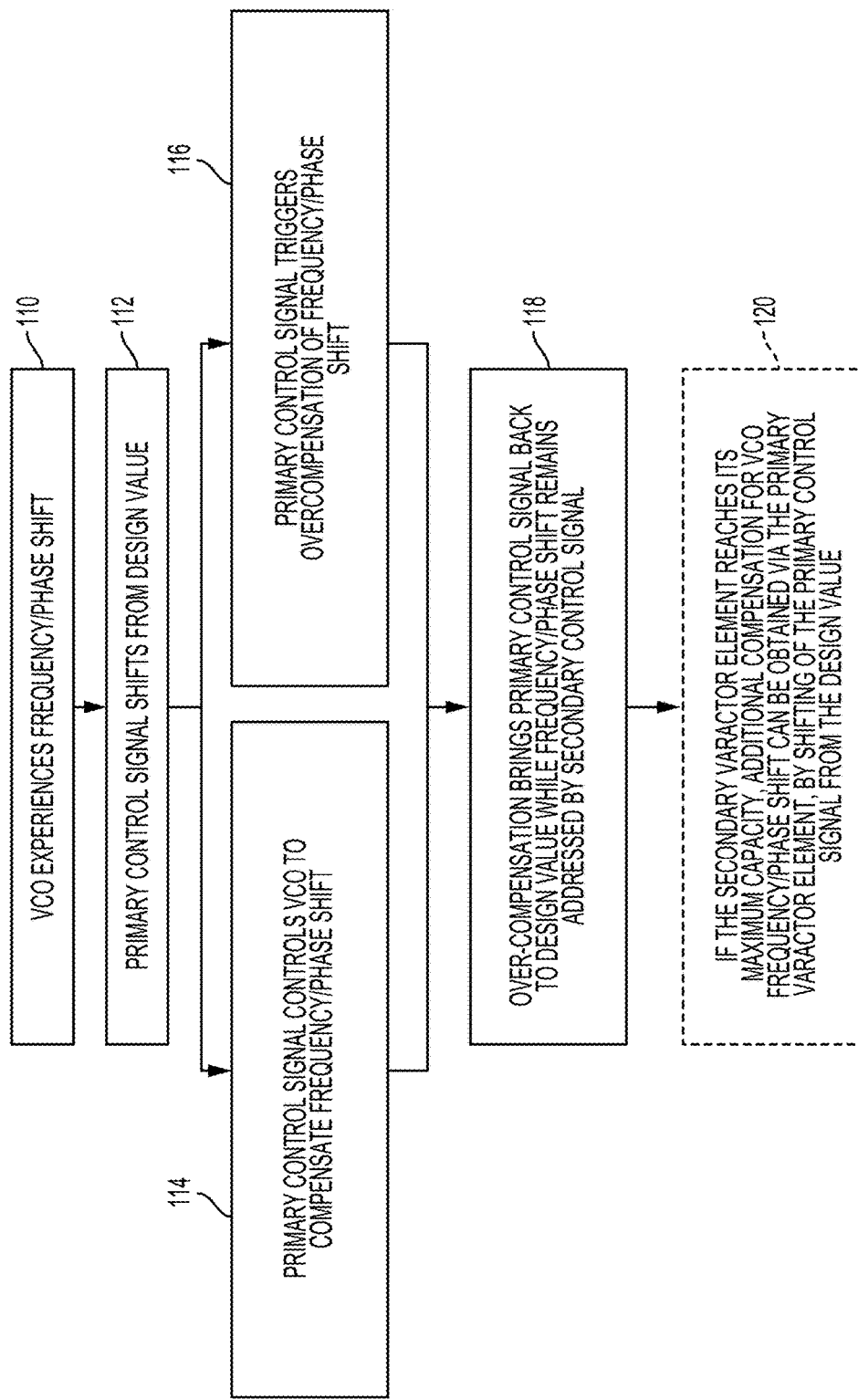
FIG. 2 is a flow chart of an example method of operating the PLL system of FIG. 1.

Accordingly, when the example PLL system 10 is submitted to a frequency/phase shift 110 of the VCO 16a, the following process, represented in the flow chart of FIG. 2, can occur:
  a. At step 112, the primary control subsystem 18 reacts to the frequency/phase shift of the VCO 16a by a shift from the design voltage value in the primary control signal 22;
  b. At step 114, the shift in the primary control signal 22 adjusts the frequency/phase of the VCO 16a as a function of the detected phase shift;
  c. At step 116, the secondary control subsystem 26 reacts to the shift in the primary control signal 22 by generating an error signal proportional to the deviation of the primary control signal 22 from the design value. The error signal can cause over-compensation of the frequency/phase of the VCO 16a;
  d. At step 118, the over-compensation of the capacitance and subsequent frequency/phase of the VCO 16a is detected by the primary control subsystem 18, which brings the primary control signal 18 back to the design value. At that point, the error signal generated by secondary control subsystem 26 becomes zero. The secondary control subsystem 18 maintains the phase lock of the VCO 16a.

To achieve this, the time constant of the primary control subsystem 18 will typically be selected to be slower than the time constant of the secondary control subsystem 26, which is to say, the reaction time of the secondary control subsystem 26 will be faster than the reaction time of the primary control subsystem 18.

Accordingly, at equilibrium, the VCO 16a frequency/phase change compensation function of the PLL system 10 can be performed while maintaining the primary control signal 22 at the design value. If a VCO of the LC-tank type is used such as presented in the example below, for instance, independent varactor elements can receive the primary control signal 22 and the secondary control signal 28, and the primary control signal 22 can remain at the design value until the secondary varactor element reaches its maximal compensation capacity. Accordingly, a secondary varactor element can also be used to provide additional compensation capacity to the PLL system 10.

Let us consider a scenario where the change in the VCO 16a frequency/phase exceeds the level where the secondary varactor element reaches its maximum capacity, or rail. In this scenario, the excess frequency shift will be addressed by the shifting of the primary control signal 22 from the design value as detailed above at step 112 of FIG. 2. However, since the secondary control subsystem 26 can no longer compensate for this excess frequency shift, the excess frequency shift will remain addressed by the shift in the primary control signal 22 (shown at step 120 of FIG. 2). This persisting shift of the primary control signal 22 is comparable in operation to the persisting shift of the primary control signal 22, which was used to compensate for the initial VCO 16a frequency shift in embodiments without a secondary control subsystem 26 as described herein.

The additional compensation capacity provided by the secondary varactor element, although achieved by shifting the primary control signal 22 from the design value, can nonetheless be useful in addressing applications where extreme VCO 16a frequency/phase changes can occur. Such extreme changes can occur in applications subjected to extreme environmental temperature variations, extreme power supply noise variations, extreme variations stemming from other sources, or extreme variations stemming from the combination of a plurality of sources, for instance.

Having discussed the general aspects of the example PLL system 10, a more detailed description of possible embodiments will now be provided.

Figure 3:
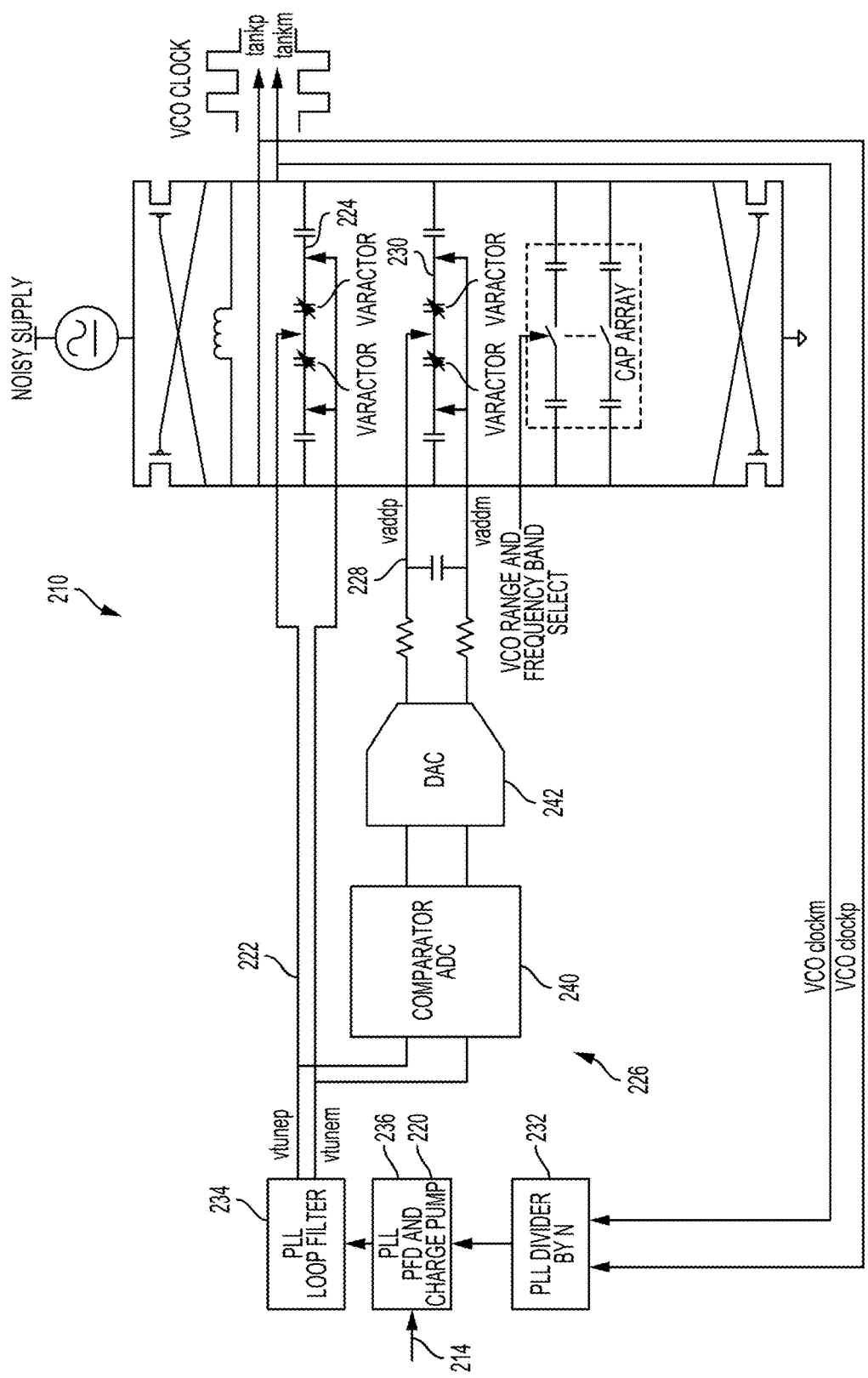
FIG. 3 is a block diagram of an example embodiment of a PLL system.

A block diagram of an example embodiment of a PLL system 210 is presented in FIG. 3. In this embodiment, the primary control signal 222 is analog and differential, and includes the values of vtunep and vtunem.

The primary control subsystem 218 includes additional components such as a PLL Divider 232 and PLL Loop filter 234, and a Charge pump 236 is integrated into the Phase Frequency Detector (PFD) 220, which receives the input signal 214 with the reference phase. The PLL Divider 232 can reduce VCO clock frequency N times for phase frequency detection. The PLL Loop filter 234 can filter the PFD 220 error signal and can be characterized by filter time constant of bandwidth. The PLL system 210 closed loop circuitry (PFD 220, PLL Loop filter 234, etc.) can keep the VCO clock equal to N times the reference clock.

The PLL system 210 compensates for frequency change by increasing or decreasing VCO differential turning voltage Vtune_diff (vtunep−vtunem). Compensation speed is inversely proportional to the time constant of the PLL Loop filter 234. The change to Vtune_diff increases or decreases VCO primary varactor element 224 capacitance.

The primary control subsystem 218 can be embodied in accordance with the disclosure of U.S. Pat. No. 8,773,184 entitled "Fully Integrated Differential LC PLL with Switched Capacitor Loop Filter", for instance. The secondary control subsystem 226 includes, in series, an analog-to-digital converter (ADC) 240 and a digital-to-analog converter (DAC) 242 and generates the second control signal 228 in the form of analog values vaddp and vaddm. As known in the art, the ADC 240 can implicitly have a comparator function.

For greater detail, the case of an example PLL system that does not have a secondary control subsystem and for which the VCO frequency is affected by a temperature change will now be examined, with reference to FIG. 4A. At a temperature T_0 the PLL output signal is locked to the desired frequency. At that point 310, the primary control signal (Vtune_diff) is equal to zero, varactor capacitance (Cvar) is equal to Cvar_0, and other varactor capacitance (Cvco) is equal to Cvco_0. Due to temperature change from T_0 to T_new, capacitance of the VCO elements changes. Total VCO capacitance at T_new will be Ctotal_new=Cvar_0+Cvco_new, leading to point 312.

The primary control subsystem (PLL closed loop circuitry) compensates for that frequency change by increasing or decreasing Vtune_diff (in the example shown in FIG. 4A, Vtune_diff decreases). The change of Vtune_diff increases or decreases the VCO primary varactor element capacitance. After a certain time defined by the time constant of the primary control subsystem, total VCO capacitance at T_new will be again equal to Ctotal_0=Cvar_new+Cvco_new, and total VCO capacitance returns to a value corresponding to the PLL desired locked frequency at point 314. If T_new>>T_0, Vtune_diff may not be able to reach a value which allows PLL lock (e.g. varactor element associated to loop reaches maximum capacity, or rail).

Frequency change can alternately, or in combination, be induced from another source. For greater detail, the case of an example PLL system that does not have a secondary control subsystem and for which the VCO frequency is affected by a supply noise change will now be examined. Reference can be made to FIG. 4A, and the movement from point 310 to 312 and then to 314, although it will be understood that the source of VCO frequency change is not the same. At a supply voltage V_0 the PLL output signal is locked to the desired frequency. At that point, the primary control signal (Vtune_diff) is equal to zero, varactor capacitance Cvar=Cvar_0, and other varactor capacitance Cvco=Cvco_0. Due to supply voltage change from V_0 to V_new, capacitance of the VCO elements changes. Total VCO capacitance at V_new will be Ctotal_new=Cvar_0+Cvco_new. The primary control subsystem (PLL closed loop circuitry) compensates for that frequency change by increasing or decreasing Vtune_diff. The change of Vtune_diff increases or decreases the VCO primary varactor element capacitance. After a certain time defined by the time constant of the primary control subsystem, total VCO capacitance at V_new will be again equal to Ctotal_0=Cvar_new+Cvco_new, and total VCO capacitance returns to a value corresponding to the PLL desired locked frequency. If frequency of the supply noise is within the loop filter bandwidth, the VCO frequency may be modulated by power supply noise changes of a type which can be referred to as deterministic of period frequency modulation, which can negatively affect performance in applications such as SerDes links, for instance.

Reference will now be made to FIGS. 4B and 4C to illustrate a possible mode of operation with a secondary control subsystem 226. At the beginning, the secondary varactor element 230 capacitance can be at point 316 on FIG. 4B. After the PLL is locked such as shown in FIG. 4A, Vtune_diff is detected by the secondary control subsystem 226 which can generate time-continuous secondary control signal Vadd_diff (Vaddp−Vaddm) and apply the signal on a compensation circuit provided in the example presented above in the form of the secondary varactor element 230. Depending on Vtune_diff, additional varactor capacitance will be adjusted to increase or decrease, moving, in the example of FIG. 4B, to point 318.

Turning now to FIG. 4C, to maintain the lock, the primary control subsystem 218 will automatically pull Vtune_diff back from point 314 to the original (design) point 320 (here ~0V). For instance, negative Vtune_diff can make Vadd_diff decrease from 0V. Vadd_diff decreasing can make Cvar increase. Cvar increasing can make the frequency of the VCO (Fvco) decrease. Fvco decreasing can make Vtune_diff increase to maintain PLL lock. The primary control subsystem (loop) can stabilize when Vtune_diff reaches design value (e.g. 0V). When temperature or supply changes, due to the same principle, and unless the secondary varactor element 230 has reached its maximum capacity, Vtune_diff will be maintained at the design point, which can be good for PLL noise performance.

FIGS. 5A and 5B illustrate an example simulated reaction of the PLL system 210 where output signal frequency (FIG. 5A) and control signal voltages (FIG. 5B) are mapped on the same time scale. The graph of FIG. 5A shows an initial frequency shift 330 of the VCO which is gradually brought back into lock with the input frequency at 340. The graph of FIG. 5B shows the initial reaction 342 of the primary control signal 222 as evidenced by the voltages of vtunep and vtunem from time 0 to time T1. Indeed, primary control subsystem 218 locks without interference of secondary control subsystem 226 before time T1, and the dynamic behaviour of the primary control subsystem 218 can be seen as evidenced in signals vtunep and vtunem.

At the next clock signal (after time T1), the secondary control subsystem 226 reacts 344 to vtunep and vtunem. The dynamic behaviour of the secondary control subsystem 226 can be seen as evidenced in signals vaddp and vaddm. The secondary control subsystem 226 at T1 responds within its time constants to the input "vtunediff="vtunep"−"vtunem" abruptly applied to its ADC inputs. The corresponding signals vaddp and vaddm override the action of vtunep and vtunem on the VCO and eventually bring vtunep and vtunem to the design value, which is of a 0 potential difference in this example, as vaddp and vaddm maintain their compensation effect at equilibrium 346.

It will be understood that the graphs are provided for purpose of illustration and show a scenario where a large step change is applied. During typical operation, temperature and noise changes are of relatively smaller magnitude and do not generate "vaddp/m" changes of the magnitude presented.

If the additional (secondary) varactor element 230 reaches its maximum range, Vadd_diff can stay at its 'rail', or maximum range (e.g. 0.8V or −0.8V, for instance), and the resulting change in primary varactor element 224 capacitance will start persisting as Vtune_diff is no longer compensated by Vadd_diff. If the secondary varactor element 230 is identical to the primary varactor element 224, the lock range with the new compensation circuit can be extended by comparison with the lock range without the new compensation circuit (e.g. original range +0.7V).

It will be understood that the varactor elements 224, 230 may include one or more varactor units in alternate embodiments.

Figure 6:
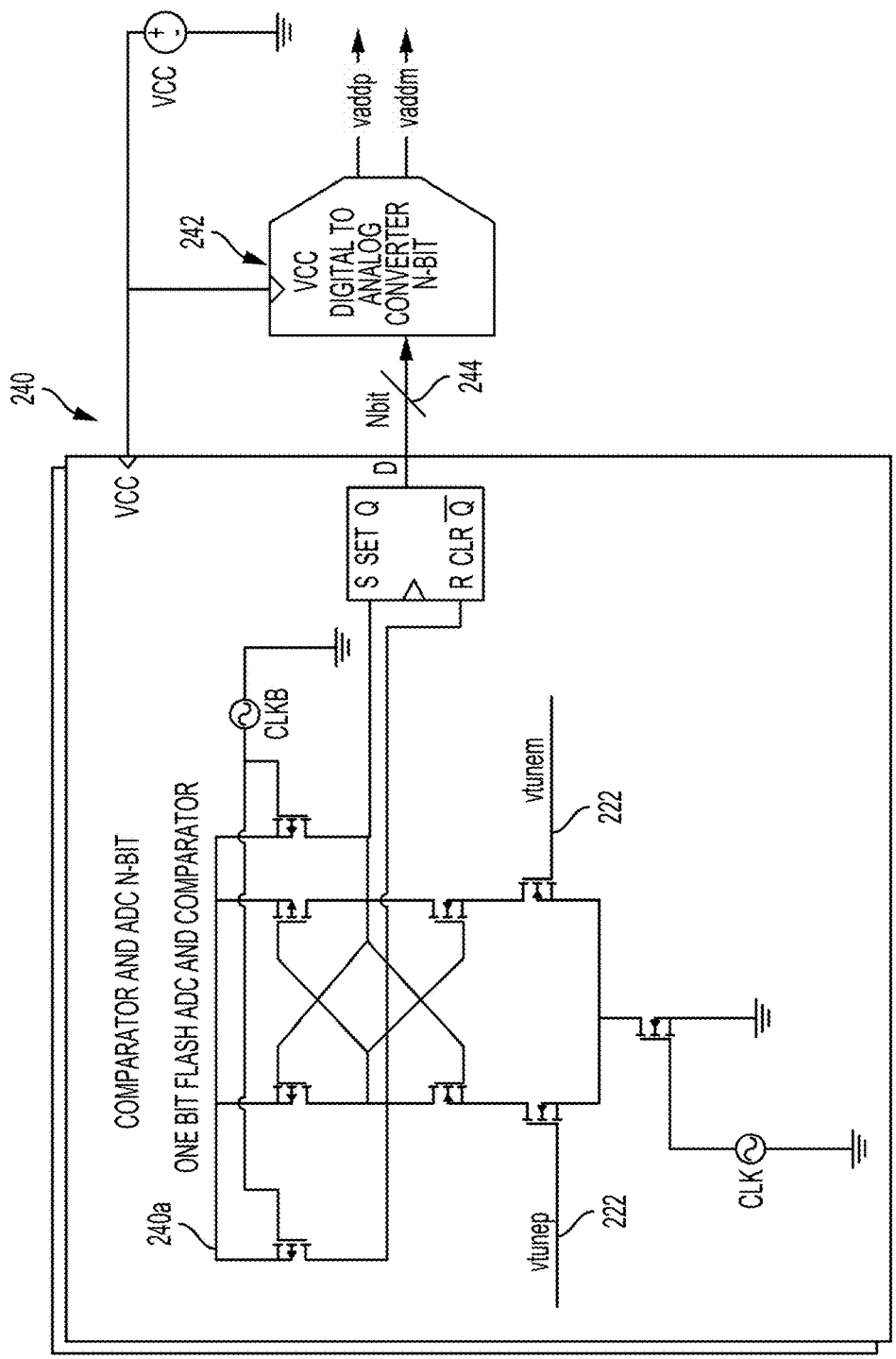
FIG. 6 is a schematic diagram of an example analog-to-digital converter used in the PLL system of FIG. 3.

FIG. 6 includes a schematic of an ADC 240 which can be used in the embodiment of FIG. 3. More specifically, the ADC 240 illustrated in FIG. 6 is a standard one-bit Flash ADC 240*a* (which has the integrated comparator function). The ADC 240 converts the analog signal 222 to a digital binary string 244. During this step, the noise from the analog comparison operation can be up-converted to clock frequency, which makes it easy to filter out as DAC's typically have a filter for clock frequency noise. Clock frequency, in this embodiment, can be as arbitrarily high as several gigahertz. Accordingly, filter implementation can be very simple, involving only one pole RC filter, for example. Alternate ADC designs can be used in alternate embodiments.

Figure 7:
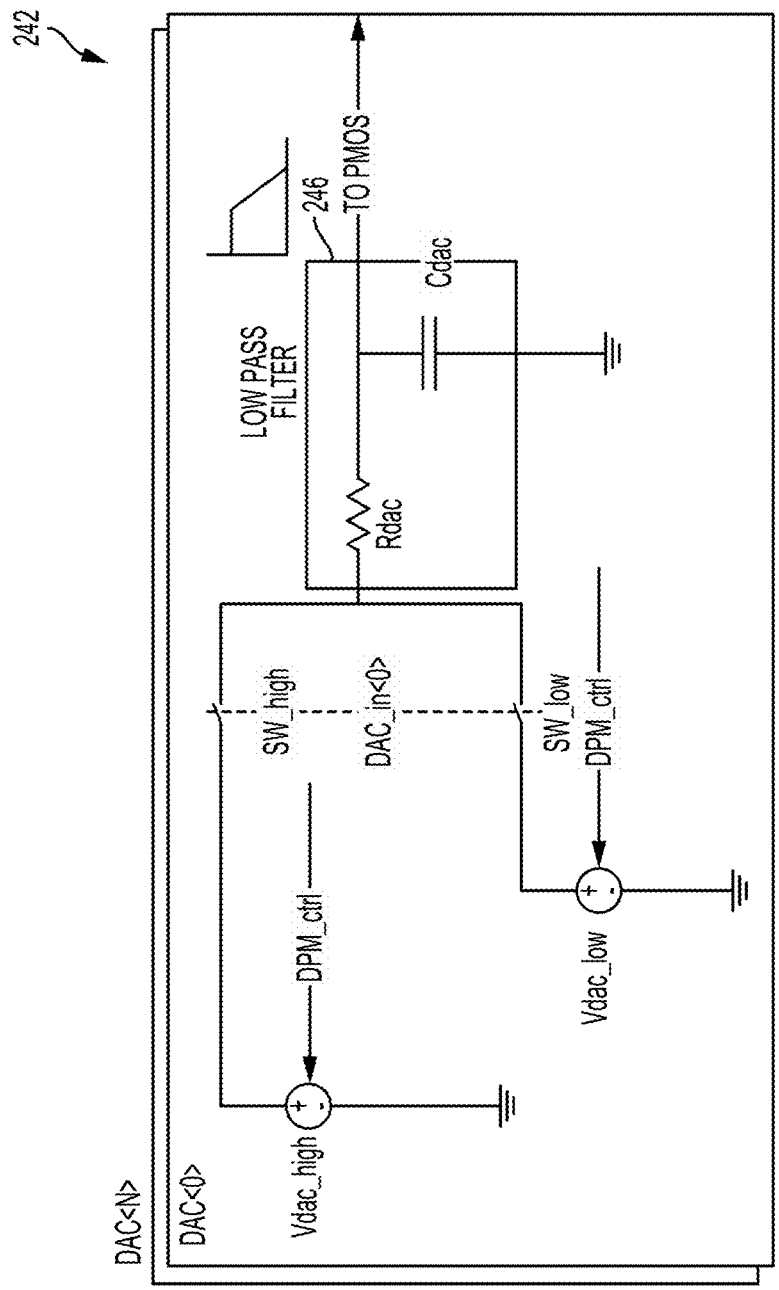
FIG. 7 is a schematic diagram of an example digital-to-analog converter used in the PLL system of FIG. 3.

FIG. 7 includes a detailed schematic of a DAC 242 which can be used in the embodiment of FIG. 3. A corresponding DAC unit can be used for each of N bits. The DAC 242 does not only convert the digital binary string 244 into analog, but also filters out, with the low pass filter 246, analog noise which has been upshifted to clock frequency due to the digital to analog transfer function. In this example, the low pass filter 246 defines the time constant of operation. The time constant of the DAC 242 (second slowest) should be slower than the time constant of the ADC 240 (fastest), while being significantly faster than the time constant of the primary control subsystem 218 in this embodiment. It will be understood that many alternate DAC designs exist and that the choice of an alternate DAC design may be made by the designer based on the specifics of a given application.

Various simulations were performed using the Cadence (trademark) design system to validate the circuit implementation. Full circuit implementation of U.S. Pat. No. 8,773, 184 has been used as the primary control subsystem 218. Circuit implementation was based on 16 nm TSMC (a silicon manufacturer) silicon models. The table below lists a table of the results, with reference to the attached figures showing graphs of the results.

TABLE 1 simulation results

| VCO supply | Supply noise fqcy | R | C | Secondary subsystem BW | PLL output jitter (TIE) | Stable |
|---|---|---|---|---|---|---|
| 1 V Voltage source | no | 10K | 2 p | 8 MHz | 157 fs | Yes |
| 1 V Voltage source | no | 20K | 2 p | 4 MHz | 73 fs | Yes |
| 1 V Voltage source | no | 40K | 2 p | 2 MHz | 76 fs | Yes |
| 1 V Voltage source | no | 80K | 2 p | 1 MHz | 70 fs | Yes |
| Voltage source with 28 mV 1 MHz noise on 1 V (p2p noise) | 1 MHz | 5K | 2 p | 16 MHz | 6 ps | Yes |
| Voltage source with 28 mV 1 MHz noise on 1 V (p2p noise) | 1 MHz | 10K | 2 p | 8 MHz | 8 ps | Yes |
| Voltage source with 28 mV 1 MHz noise on 1 V (p2p noise) | 1 MHz | 1M | 2 p | 80 KHz | 56 ps | Yes |

Based on these simulations it is predicted that that embodiments should be able to operate at low supply voltages in the 1V order with compensating up to +/−5% added supply noise.

More specifically, an open loop PLL transfer function, which often used for loop stability and noise analysis in the case of a PLL having only a primary control subsystem can be written as:

$$H_{ol(S)} = \frac{K_{pd} \times K_{vco} \times I_{cp}}{s \times N} \times H(s) \quad (1)$$

where:

$K_{pd}$—is phase detector gain
$I_{cp}$—is charge pump current
$K_{vco}$—is VCO gain. For conventional PLL $K_{vco}$ is frequency independent constant.
$H_{(s)}$—is loop filter transfer function
N—is PLL divider division ratio
$s=j\times 2\times \pi \times f$—is complex number frequency (f is for frequency)

Loop transfer function can be as simple as:

$$H(s) = R_{lf} + \frac{1}{C_{lf} \times s} \quad (2)$$

where:

$R_{lf}$ and $C_{lf}$ are loop filter resistance and capacitance.

In case of PLL which further has a secondary control subsystem such as described above, $K_{vco}$ can be replaced by following frequency dependent equation:

$$\overline{K_{vco}} = K_{vco} * \left(1 - \alpha \times \frac{1}{s \times \tau + 1}\right) \quad (3)$$

where:

$\overline{K_{vco}}$—is VCO gain of PLL including secondary control subsystem $$\alpha = \frac{C_{varactor\ compensator}}{C_{varactor\ main}} < 1$$

is a coefficient that relates nominal capacitances of primary and secondary varactor elements, and τ—is time constant of ADC and DAC chain;

In our case of time constant of the DAC dominating in time constant of ADC+DAC chain, and RC filter used as DAC $\tau = R_{DAC} \times C_{DAC}$.

Finally open loop gain of the PLL with compensator can be written as:

$$H_{ol(S)} = \frac{K_{pd} \times \overline{K_{vco}} \times I_{cp}}{s \times N} \times H(s) \quad (4)$$

The equation above can be used as a basis for PLL noise and stability analysis for the design selection of compensator a and T.

Figure 8:
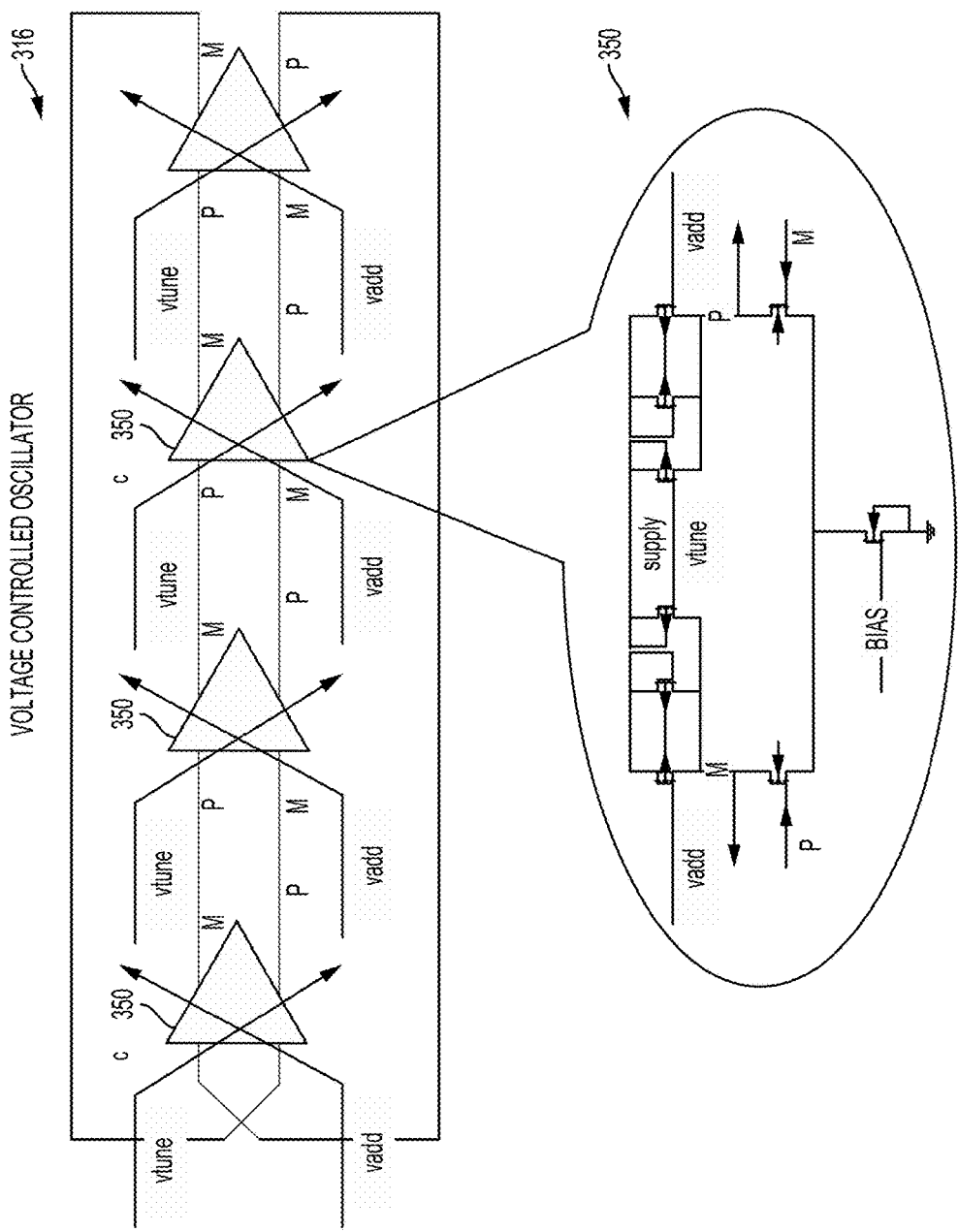
FIG. 8 is a block diagram of an alternate embodiment of a voltage-controlled oscillator which can be used in a PLL system.

As can be understood, the examples described above and illustrated are intended to be exemplary only. Embodiments of the phase-lock loop system can be applied to various applications, including applications such as high speed serial-to-parallel interfaces where low-speed parallel data is compressed into serial buses at 10ths of GHz which can occur with optic cables or master clocks, for instance. Depending on the application, the embodiments can be very broadband, such as above 1 GHz, 5 GHz, 10 GHz or 15 GHz, and the embodiments can be adapted to applications sensitive to noise in a wide range of frequencies. Various alternate forms of primary control subsystems (PLL control loop) exist and a suitable alternate form can be selected by the designer for alternate embodiments. Embodiments can be provided in small size, low current, and integrated on chip. In alternate applications, the details of implementation of the VCO can vary. For instance, an alternate PLL system can have another form of LC tank VCO than the one illustrated in FIG. 3 and described above. In still another alternate embodiment, a PLL system can have a VCO in the form of a ring VCO, or still another alternate form of VCO. An example of an implementation with a ring VCO is shown in FIG. 8. This ring VCO 316 is an example of a relatively straightforward embodiment where the primary control subsystem and the secondary control subsystem of the PLL system incorporating the ring VCO 316 can be relatively similar in function as those described in greater detail above. The primary control signal "vtune" (p, m) and secondary control signal "vadd" (p, m) can be used in the PLL system to provide similar functions as those described above. More specifically, the VCO 316 has a plurality of gates 350 in a ring configuration, and each gate 350 can be based on the schematic shown in the bottom portion of FIG. 8. The details of an example control signal connection is also shown on this schematic. Accordingly, the scope is indicated by the appended claims.

What is claimed is:

1. A phase-lock loop (PLL) system for generating an output signal being phase-locked to an input signal, the PLL system comprising:
   a variable frequency oscillator being adjustable to control a phase/frequency of the output signal;
   a primary control subsystem including a phase detector and a connection between the output signal and the phase detector, the phase detector being configured to compare phases of the input signal and of the output signal, and generate a primary control signal based on the comparison, the primary control signal being analog and shifting from a design value in response to differences between the input signal and the output signal, and connected to adjust the variable frequency oscillator; and
   a secondary control subsystem, coupled to the PLL, and having an analog-to-digital converter, a digital-to-analog converter, and a low-pass filter coupled in series between the primary control signal and the variable frequency oscillator, with an output of the analog-to-digital converter being directly connected to the digital-to-analog converter, and thereby generating a secondary control signal being analog, shifting proportionally in response to said shifting of the primary control signal and connected to continuously adjust the variable frequency oscillator.

2. The PLL system of claim 1 wherein the analog-to-digital converter is a flash comparator ADC having a lower time constant than the digital-to-analog converter, and the digital-to-analog converter has a lower time constant than the primary control subsystem.

3. The PLL system of claim 1 having an output frequency of above 1 GHz.

4. The PLL system of claim 1 wherein the variable frequency oscillator is a LC tank VCO having a primary varactor element and a secondary varactor element, both varactor elements being independently adjustable to control a phase/frequency of the output signal, wherein the primary control signal is connected to adjust the primary varactor element, and the secondary control signal is connected to adjust the secondary varactor element.

5. The PLL system of claim 1 wherein the variable frequency oscillator is a ring oscillator.

6. The PLL system of claim 3, having an output frequency above 5 GHz.

7. A method of operating a phase-lock loop (PLL) system having a variable frequency oscillator, a primary control subsystem including a phase detector, and a secondary control subsystem, the method comprising:
   changing a frequency of the variable frequency oscillator; thereby changing an output signal from a former phase to a subsequent phase;
   the primary control subsystem generating a primary control signal indicative of a difference between the subsequent phase and a phase of an input signal, the primary control signal being shifted from a design value;
   the primary control signal controlling the variable frequency oscillator to adjust the frequency/phase of the output signal as a function of the phase of the input signal to compensate for the changing of frequency;
   the secondary control subsystem reacting to the primary control signal by shifting a secondary control signal proportionally to the shift of the primary control signal from the design value the secondary control signal also controlling the variable frequency oscillator to adjust a frequency/phase of the output signal as a function of the phase of the input signal, resulting in overcompensation of the changing of frequency;
   the primary control subsystem modifying the primary control signal in reaction to said overcompensation by bringing the primary control signal back to the design value; and
   the secondary control subsystem maintaining the control of the variable frequency oscillator and the adjustment of the frequency/phase of the output signal once the primary control signal is back to the design value.

8. The method of claim 7 wherein the reacting of the secondary control subsystem includes converting a value of the shift in the primary control signal from the design value into the shift in the secondary control signal including performing; in sequence, an analog-to-digital conversion function and a digital-to-analog conversion function.

9. The method of claim 7 wherein the voltage controlled oscillator has a primary varactor element receiving the primary control signal, and a secondary varactor element receiving the second control signal and being controlled by the secondary control subsystem independently of the primary control subsystem.

10. The method of claim 9 being performed iteratively until the secondary varactor element reaches its maximum adjustment capacity, further comprising the step of:
    while maintaining the secondary varactor element at maximum adjustment capacity via the secondary control signal, compensating additional frequency/phase change of the output signal via the primary control subsystem and the primary varactor element, by maintaining the primary control signal off the design value.

11. The method of claim 7 wherein the change in the frequency of the variable frequency oscillator stems from a change in environmental temperature.

12. The method of claim 7 wherein the change in the frequency of the variable frequency oscillator stems from a change in power supply noise.

13. The method of claim 7 wherein the change in the frequency of the variable frequency oscillator stems from both a change in environmental temperature and a change in power supply noise.

14. The method of claim 7 further comprising the secondary control subsystem first up-converting noise to a clock frequency thereof and secondly filtering out the up-converted noise.

15. The PLL system of claim 6, having an output frequency above 10 GHz.

16. The method of claim 7 wherein a reaction time of the secondary control subsystem is faster than a reaction time of the primary control subsystem.

17. A method of operating a phase-lock loop (PLL) system having a variable frequency oscillator, a primary control subsystem including a phase detector, and a secondary control subsystem, the method comprising:

changing a frequency of the variable frequency oscillator, thereby changing an output signal from a former phase to a subsequent phase;

the primary control subsystem generating a primary control signal ndicative of a difference between the subsequent phase and a phase of an input signal, the primary control signal being shifted from a design value;

the primary control signal controlling the variable frequency oscillator to adjust the frequency/phase of the output signal as a function of the phase of the input signal to compensate for the changing of frequency;

the secondary control subsystem reacting to the primary control signal and also controlling the variable frequency oscillator to adjust a frequency/phase of the output signal as a function of the phase of the input signal, resulting in overcompensation of the changing of frequency, the secondary control subsystem first up-converting noise to a clock frequency thereof and secondly filtering out the up-converted noise;

the primary control subsystem modifying the primary control signal in reaction to said overcompensation by bringing the primary control signal back to the design value; and the secondary control subsystem maintaining the control of the variable frequency oscillator and the adjustment of the frequency/phase of the output signal once the primary control signal is back to the design value.

\* \* \* \* \*